(12) United States Patent
Rajoo et al.

(10) Patent No.: US 11,658,128 B2
(45) Date of Patent: May 23, 2023

(54) SHIELDING ELEMENTS FOR PACKAGES OF SEMICONDUCTOR DEVICES

(71) Applicant: GLOBALFOUNDRIES Singapore Pte. Ltd., Singapore (SG)

(72) Inventors: Ranjan Rajoo, Singapore (SG); Venkata Narayana Rao Vanukuru, Bangalore (IN)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/407,162

(22) Filed: Aug. 19, 2021

(65) Prior Publication Data
US 2023/0056509 A1   Feb. 23, 2023

(51) Int. Cl.
| H01L 23/552 | (2006.01) |
| H01L 21/56 | (2006.01) |
| H01L 49/02 | (2006.01) |
| H01L 23/31 | (2006.01) |

(52) U.S. Cl.
CPC ............ H01L 23/552 (2013.01); H01L 21/56 (2013.01); H01L 23/3128 (2013.01); H01L 28/10 (2013.01)

(58) Field of Classification Search
CPC ... H01L 23/552; H01L 21/56; H01L 23/3128; H01L 28/10; H01L 28/20; H01L 28/40
USPC .......................................................... 257/659
See application file for complete search history.

(56) References Cited

U.S. PATENT DOCUMENTS

| 7,851,893 | B2 | 12/2010 | Kim et al. |
| 8,786,060 | B2 | 7/2014 | Yen et al. |
| 9,685,403 | B2 | 6/2017 | Pagaila |
| 10,643,952 | B2 | 5/2020 | Pagaila et al. |
| 10,714,434 | B1 | 7/2020 | Pietambaram et al. |
| 10,741,501 | B1* | 8/2020 | Shirley ............. H01L 21/32115 |
| 10,756,161 | B2 | 8/2020 | Balasubramanian et al. |
| 2010/0193905 | A1 | 8/2010 | Kim et al. |
| 2017/0169934 | A1 | 6/2017 | Stamper et al. |
| 2017/0301628 | A1* | 10/2017 | Kawabata ......... H01L 21/32051 |

OTHER PUBLICATIONS

Donald S. Gardner et al., Integrated On-Chip Inductors with Magnetic Films, IEEE Transactions on Magnetics, Jun. 2007, pp. 2615-2617, vol. 43—No. 6, IEEE.

* cited by examiner

Primary Examiner — Didarul A Mazumder
(74) Attorney, Agent, or Firm — Anthony Canale

(57) ABSTRACT

The embodiments herein relate to packages of semiconductor devices having a shielding element and methods of forming the same. An assembly is provided. The assembly includes a semiconductor chip having a passive component and a package within which the semiconductor chip is positioned in. The package includes a shielding element and a package conductive component, and the package conductive component is electrically coupled with the passive component of the semiconductor chip.

17 Claims, 6 Drawing Sheets

SHIELDING ELEMENTS FOR PACKAGES OF SEMICONDUCTOR DEVICES

TECHNICAL FIELD

The present disclosure relates generally to packages of semiconductor devices, and more particularly to packages having shielding elements and methods of forming the same.

BACKGROUND

A semiconductor chip that has completed fabrication may be assembled within a package to form a packaged semiconductor device. The package may function as a supporting structure and may provide a means for electrically coupling the semiconductor chip to a circuit board and/or other semiconductor chips. The package may further serve to dissipate heat and protect the semiconductor chip against external contamination and/or environmental effects, such as moisture and/or particles.

The packaged semiconductor device may be affected by the size of the semiconductor chip and the size of the package. A smaller semiconductor chip may be achieved by improvements in the front-end manufacturing, for example, by forming a higher density of smaller electrical components and/or improving electrical wirings therewithin. A smaller package may be achieved by improvements in the back-end manufacturing, for example, by forming smaller electrical components, improving electrical wirings therewithin, and/or improving packaging materials.

However, as the electrical components of the packaged semiconductor device are being integrated closer, these electrical components may be susceptible to undesirable electromagnetic interferences or coupling (also referred to as crosstalk) from neighboring electrical components. Such interferences may adversely affect the electrical performance of the packaged semiconductor device.

Therefore, solutions to overcome, or at least ameliorate, the disadvantage described above are desired.

SUMMARY

To achieve the foregoing and other aspects of the present disclosure, packages of semiconductor devices having shielding elements and methods of forming the same are presented.

According to an aspect of the present disclosure, an assembly is provided. The assembly includes a semiconductor chip having a passive component and a package within which the semiconductor chip is positioned in. The package includes a shielding element and a package conductive component, and the package conductive component is electrically coupled to the passive component of the semiconductor chip.

According to another aspect of the present disclosure, an assembly is provided. The assembly includes a semiconductor chip having a passive component and a package within which the semiconductor chip is positioned in. The package includes a mold compound, a magnetic shielding element, a package conductive component, and an electrically insulative layer. The package conductive component is electrically coupled to the passive component of the semiconductor chip. The electrically insulative layer is interposed between the magnetic shielding layer and the package conductive component to electrically isolate the package conductive component from the magnetic shielding element.

According to yet another aspect of the present disclosure, a method of forming an assembly is provided. The method includes forming a shielding element over a semiconductor chip having a passive component and forming a package conductive component over the shielding element. A mold compound is formed over the package conductive component such that the shielding element, the package conductive component, and the mold compound form a package within which the semiconductor chip is positioned in. Interconnects are formed over the semiconductor chip to provide electrical coupling between the package conductive component and the passive component of the semiconductor chip.

BRIEF DESCRIPTION OF THE DRAWINGS

The embodiments of the present disclosure will be better understood from a reading of the following detailed description, taken in conjunction with the accompanying drawings.

Figure 1:
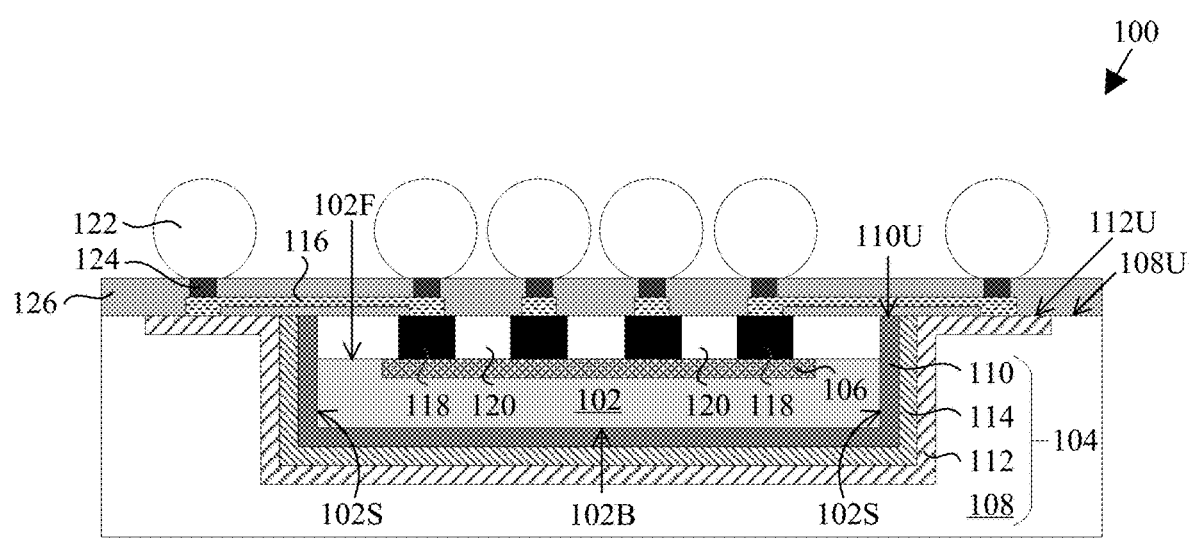
FIG. 1 is a cross-sectional view of a packaged semiconductor device, according to an embodiment of the disclosure.

For simplicity and clarity of illustration, the drawings illustrate the general manner of construction, and certain descriptions and details of features and techniques may be omitted to avoid unnecessarily obscuring the discussion of the described embodiments of the device.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates generally to packages of semiconductor devices, and more particularly to packages having shielding elements and methods of forming the same.

A packaged semiconductor device may include an assembly of a semiconductor chip in a package. The semiconductor chip may include various types of active and passive electrical components. The active electrical components may include, but not limited to, transistors, triode vacuum tubes (valves), or tunnel diodes. The passive electrical components may include, but not limited to, resistors, capacitors, inductors, or transformers. The active electrical components and the passive electrical components may be electrically coupled to enable the semiconductor chip to perform the intended application.

As used herein, when an element is referred to as being "connected" or "coupled" to another element, the element can be directly connected or coupled to the other element or intervening elements may be present. In contrast, when an element is referred to as being "directly connected" or "directly coupled" to another element, there are no intervening elements present.

The following disclosure is not limited to any particular type of semiconductor chips. The disclosure may be applied to any type of semiconductor chips, such as memory chips, microprocessors, standard chips, and systems-on-a-chip (SoCs), for various semiconductor applications, such as low or high-frequency applications, as well as low, medium, or high power applications.

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

FIG. 1 is a cross-sectional view of a packaged semiconductor device 100, according to an embodiment of the disclosure. The packaged semiconductor device 100 is illustrated in a "face-up" orientation (i.e., electrical connections to the packaged semiconductor device 100 are facing "up"). The packaged semiconductor device 100 may include an assembly of a semiconductor chip 102 positioned in a package 104.

The semiconductor chip 102 may include a front surface 102F and a back surface 102B laterally opposite the front surface 102F. The semiconductor chip 102 may include, among other things, one or more active electrical components, one or more passive electrical components, conductive layers, and/or dielectric layers that are positioned proximal to the front surface 102F of the semiconductor chip 102. For example, as illustrated in FIG. 1, a passive electrical component 106 may be positioned proximal to the front surface 102F of the semiconductor chip 102. In an embodiment of the disclosure, the passive electrical component 106 may include an inductor. In another embodiment of the disclosure, the passive electrical component 106 may include a transformer.

The package 104 may include a mold compound 108, a shielding element 110, and a package conductive component 112. The mold compound 108 may protect the semiconductor chip 102 against external contamination and/or environmental effects, such as moisture and/or particles.

The shielding element 110 may be positioned between the package conductive component 112 and the semiconductor chip 102. The shielding element 110 may be further spaced apart from the package conductive component 112 by an electrically insulative layer 114. In an embodiment of the disclosure, the package conductive component 112 may have an upper surface 112U and the mold compound 108 may have an upper surface 108U that is substantially coplanar with the upper surface 112U of the package conductive component 112. In another embodiment of the disclosure, the shielding element 110 may have an upper surface 110U that is substantially coplanar with the upper surface 112U of the package conductive component 112.

The shielding element 110 may include an electromagnetic shielding element or a magnetic shielding element. The shielding element 110 may be suitable to shield various forms of electromagnetic or magnetic interferences or coupling that may arise between the semiconductor chip 102 and the package conductive component 112, thereby enabling the packaged semiconductor device 100 to achieve better performance. For example, where the passive electrical component 106 is an inductor, the shielding element 110 advantageously improves the inductance and Q factor of the inductor. In another example, where the passive electrical component 106 is a transformer, the shielding element 110 advantageously improves the coupling factor of the transformer. In an embodiment of the disclosure, the shielding element 110 may include a material with magnetic permeability such as, but not limited to, cobalt or alloy compositions of zinc including cadmium zinc telluride (CZT), nickel-zinc-copper (Ni—Zn—Cu), zinc ferrite, or combinations thereof. In an embodiment of the disclosure, the shielding element 110 may have a thickness of about 0.01 mm or less.

As mentioned above, the semiconductor chip 102 may be positioned in the package 104. The semiconductor chip 102 may be positioned adjacent to the shielding element 110. In an embodiment of the disclosure, the shielding element 110 may adjoin the back surface 102B of the semiconductor chip 102. In another embodiment of the disclosure, the shielding element 110 may adjoin the back surface 102B and side surfaces 102S of the semiconductor chip 102, acquiring a U-shaped profile.

The package conductive component 112 may include an electrical component, for example, a passive electrical component such as a package inductor. In an embodiment of the disclosure, the package conductive component 112 may further include a conductive wiring integrated with an electrical component, where the conductive wiring provides electrical coupling between the electrical component in the package 104 and the semiconductor chip 102.

The packaged semiconductor device 100 may further include a chip redistribution layer (RDL) 116 and a plurality of external interconnects 122. As illustrated in FIG. 1, the chip RDL 116 may be electrically isolated from the shielding element 110 of the package 104. The chip RDL 116 may be positioned over the front surface 102F of the semiconductor chip 102. The chip RDL 116 may provide electrical coupling between the semiconductor chip 102 and the package 104, such as to the package conductive component 112, through a contact structure 118. The contact structure 118 may be positioned within a dielectric layer 120 that may serve to electrically isolate the contact structure 118 from adjacent conductive features, for example, neighboring contact structures 118 and/or the shielding element 110 of the package 104.

The plurality of external interconnects 122 may be provided to enable electrical coupling between the packaged semiconductor device 100 and external components (not shown), such as other packaged semiconductor devices or a printed circuit board (PCB). In an embodiment of the disclosure, the plurality of external interconnects 122 may be electrically coupled to the chip RDL 116 through a plurality of contact structures 124. In another embodiment of the disclosure, the plurality of external interconnects 122 may include solder bumps or conductive pillar structures.

In order to protect the packaged semiconductor device 100 from external contamination and/or environmental effects, a passivation layer 126 may be provided over the packaged semiconductor device 100. The passivation layer 126 may be a one-layer or a multi-layer passivation stack that overlays the semiconductor chip 102 and the package 104. In an embodiment of the disclosure, the passivation layer 126 may embed the chip RDL 116 and may provide electrical isolation between the chip RDL 116 and the shielding element 110. In another embodiment of the disclosure, the passivation layer 126 may further embed the plurality of contact structures 124.

Figure 2A:
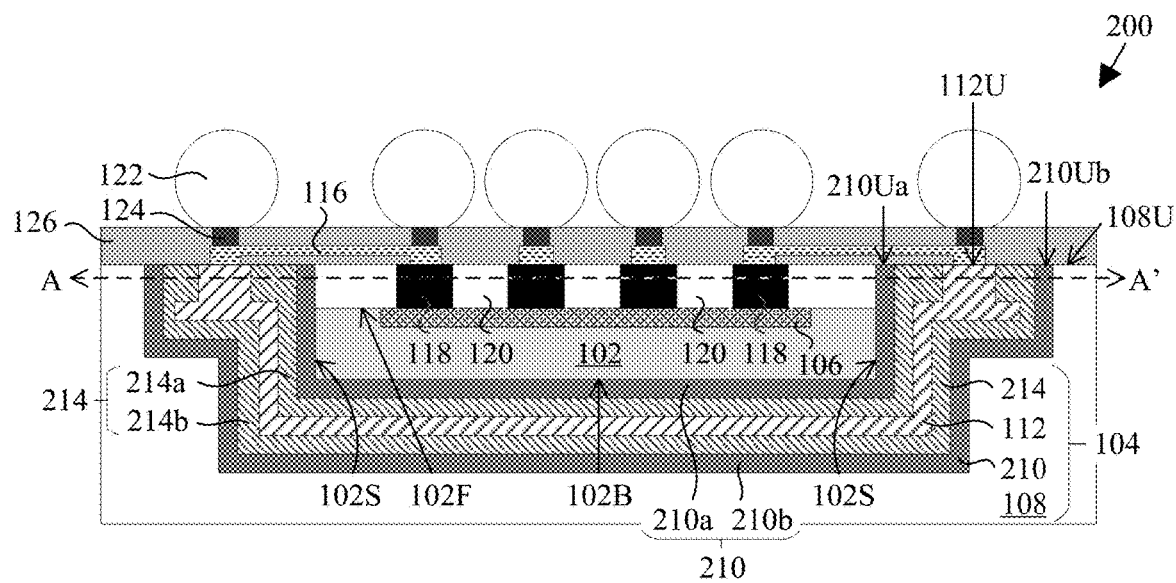
FIG. 2A is a cross-sectional view of a packaged semiconductor device, according to another embodiment of the disclosure.

FIG. 2A is a cross-sectional view of a packaged semiconductor device 200, according to another embodiment of the disclosure. The packaged semiconductor device 200 is similar to the packaged semiconductor device 100 in FIG. 1, and thus common features are labeled with the same reference numerals and need not be discussed.

The packaged semiconductor device 200 may include a shielding element 210; the shielding element 210 is analogous to the shielding element 110 in FIG. 1. The shielding element 210 may shield the package conductive component 112 from surrounding conductive components, such as the passive electrical component 106 and/or the package conductive component 112. For example, the shielding element 210 may include a shielding element portion 210a positioned between the semiconductor chip 102 and the package conductive component 112, and another shielding element portion 210b positioned between the package conductive component 112 and the mold compound 108. The shielding element portion 210a may have an upper surface 210Ua and the shielding element portion 210b may have an upper surface 210Ub that is substantially coplanar with the upper surface 210Ua of the shielding element portion 210a. In an embodiment of the disclosure, the shielding element portion of 210a may be electrically isolated from the shielding element portion 210b.

Accordingly, an electrically insulative layer 214 may separate and electrically insulate the package conductive component 112 from the shielding element 210; the electrically insulative layer 214 is analogous to the electrically insulative layer 114 in FIG. 1. For example, the electrically insulative layer 214 may include an insulative portion 214a positioned between the shielding element portion 210a and the package conductive component 112, and another insulative portion 214b positioned between the package conductive component 112 and the shielding element portion 210b. In an embodiment of the disclosure, the upper surface 210Ua of the shielding element portion 210a is substantially coplanar with the upper surface 210Ub of the shielding element portion 210b. In another embodiment of the disclosure, the upper surface 210Ua and the upper surface 210Ub are substantially coplanar with the upper surface 108U of the mold compound 108.

Figure 2B:
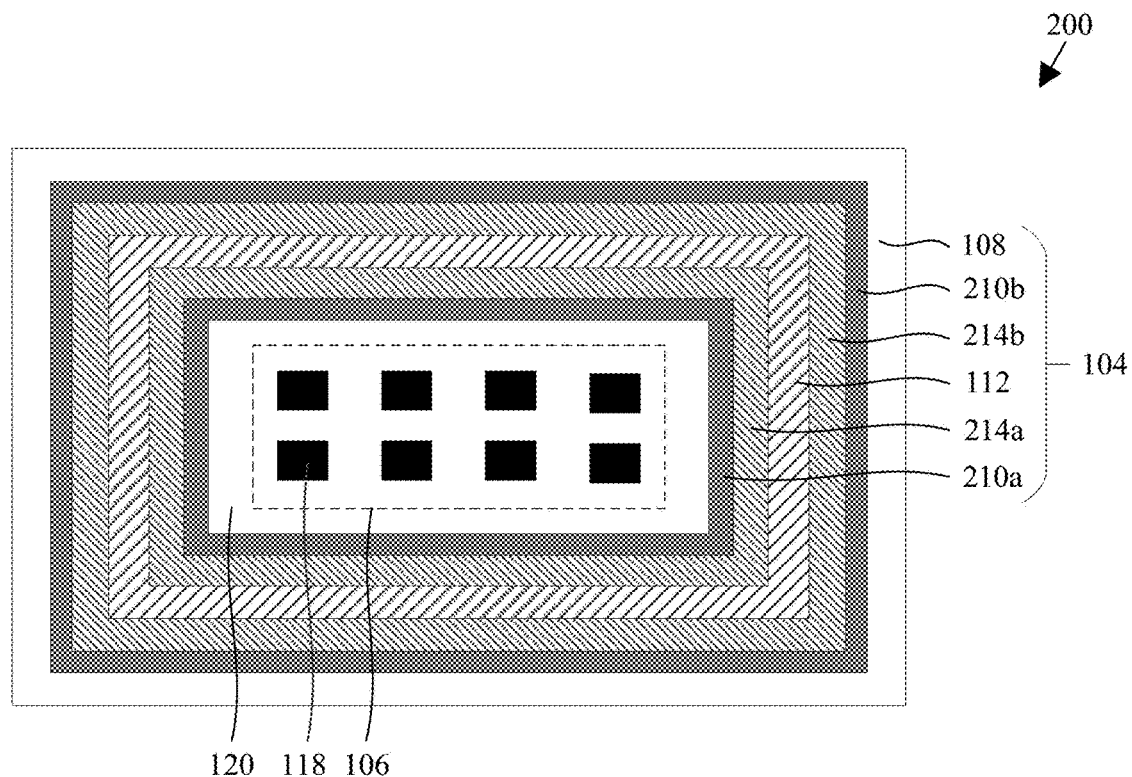
FIG. 2B is a plan view corresponding to a region of the packaged semiconductor device in FIG. 2A, taken along a line A-A', according to an embodiment of the disclosure.

FIG. 2B is a plan view corresponding to a region taken along a line A-A' of the packaged semiconductor device 200 in FIG. 2A, according to an embodiment of the disclosure. The passive electrical component 106 is illustrated with a dashed outline. The shielding element portion 210a may be spaced apart from the package conductive component 112 by the insulative portion 214a, and the shielding element portion 210b may be spaced apart from the package conductive component 112 by the insulative portion 214b.

Figure 3A:
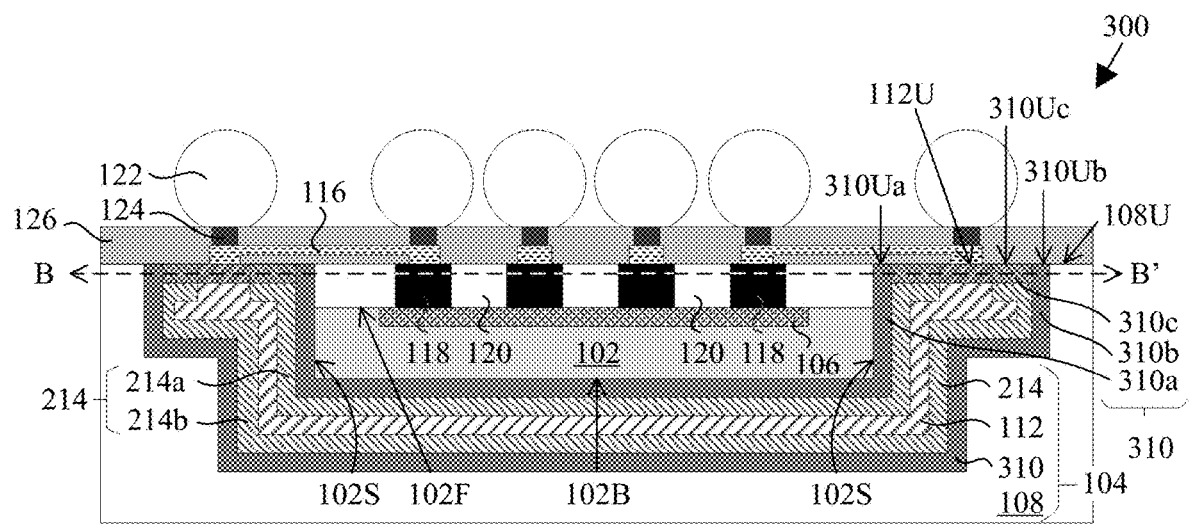
FIG. 3A is a cross-sectional view of a packaged semiconductor device, according to yet another embodiment of the disclosure.

FIG. 3A is a cross-sectional view of a packaged semiconductor device 300, according to yet another embodiment of the disclosure. The packaged semiconductor device 300 is similar to the packaged semiconductor device 200 in FIG. 2, and thus common features are labeled with the same reference numerals and need not be discussed.

The packaged semiconductor device 300 may include a shielding element 310; the shielding element 310 is analogous to the shielding element 210 in FIG. 2. The shielding element 310 may include a shielding element portion 310a and another shielding element portion 310b; the shielding element portion 310a and the shielding element portion 310b are analogous to the shielding element portion 210a and the shielding element portion 210b, respectively, in FIG. 2A. The shielding element portion 310a may have an upper surface 310Ua and the shielding element portion 310b may have an upper surface 310Ub that is substantially coplanar with the upper surface 310Ua.

The shielding element 310 may further include a shielding element portion 310c directly connecting the shielding element portion 310a and the shielding element portion 310b at the upper surface 108U of the mold compound 108. For example, the shielding element portion 310c may have an upper surface 310Uc, and the upper surface 310Uc of the shielding element portion 310c is substantially coplanar with the upper surface 310Ua of the shielding element portion 310a and the upper surface 310Ub of the shielding element portion 310b. The shielding element portions 310a, 310b, and 310c are directly and electrically connected to form a loop around the package conductive component 112.

Figure 3B:
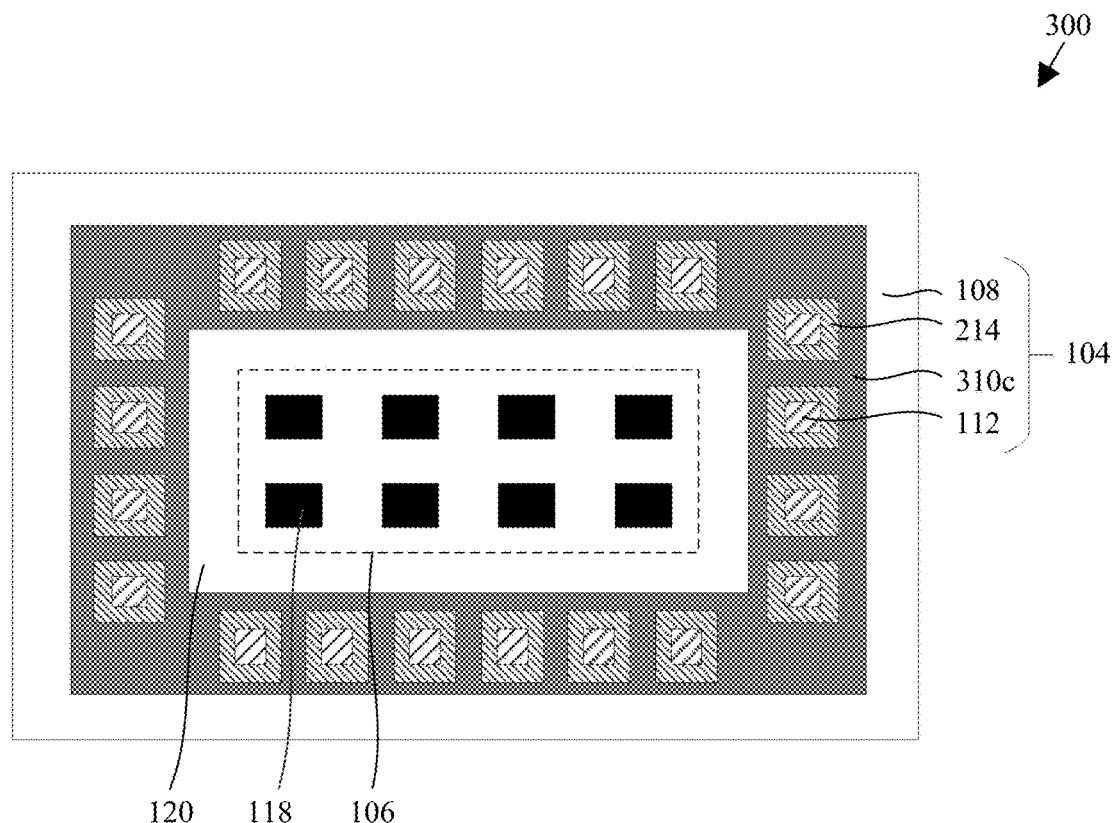
FIG. 3B is a plan view corresponding to a region of the packaged semiconductor device in FIG. 2A, taken along a line B-B', according to an embodiment of the disclosure.

FIG. 3B is a plan view corresponding to a region taken along a line B-B' of the packaged semiconductor device 300 in FIG. 3A, according to an embodiment of the disclosure. The passive electrical component 106 is illustrated with a dashed outline. Openings (not shown) may be formed in the shielding element portion 310c at predetermined locations where the external interconnects 122 are designed to be placed, and the package conductive component 112 may be formed through the opening to be electrically coupled to the external interconnects 122. In an embodiment of the disclosure, the upper surface 112U of the package conductive component 112 may be substantially coplanar with the upper surface 310Uc of the shielding element portion 310c.

FIGS. 4A to 4H are cross-sectional views that illustrate a method of forming the packaged semiconductor device 100 in FIG. 1, according to an embodiment of the disclosure.

As used herein, "deposition techniques" refer to the process of applying a material over another material (or the substrate). Exemplary techniques for deposition may include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), or atomic layer deposition (ALD).

Additionally, "patterning techniques" may include deposition of sacrificial material or photoresist, patterning, exposure, development, etching, cleaning, and/or removal of the sacrificial material or photoresist as required in forming a described pattern, structure, or opening. Exemplary examples of techniques for patterning may include, but not limited to, wet etch lithographic processes, dry etch lithographic processes, or direct patterning processes.

Figure 4A:
FIGS. 4A to 4H are cross-sectional views that illustrate a method of forming the packaged semiconductor device in FIG. 1, according to an embodiment of the disclosure.
Figure 4B:
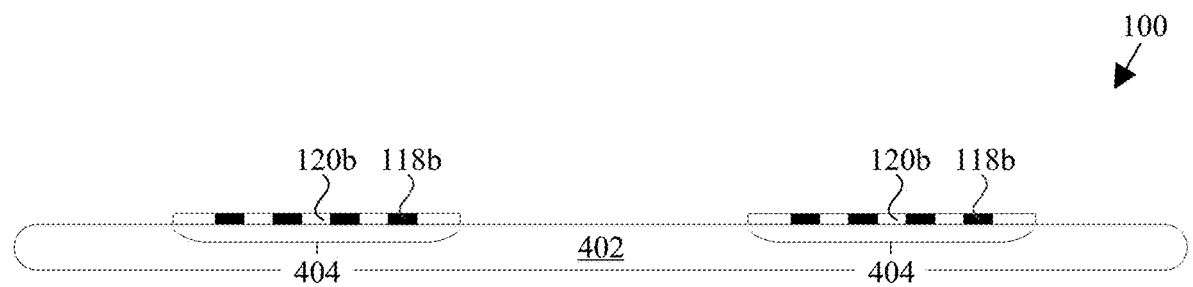

FIGS. 4A and 4B illustrate various elements for fabricating the packaged semiconductor device 100, according to an embodiment of the disclosure. FIG. 4A illustrates a plurality of semiconductor chips 102. The plurality of semiconductor chips 102 may be singulated from a wafer (not shown) using a wafer singulation technique. The plurality of semiconductor chips 102 is illustrated in a "face-up" orientation (i.e., electrical connections to the plurality of semiconductor chips 102 are facing "up").

Each semiconductor chip 102 may include at least a passive electrical component 106 and may be provided with at least one on-chip contact structure 118a that may serve to provide electrical coupling access to the semiconductor chip 102. The on-chip contact structure 118a may be positioned in a dielectric layer 120a that may be deposited over the semiconductor chip 102.

FIG. 4B illustrates a wafer 402. The wafer 402 may be a handle wafer that may provide structural support for safe handling and/or processing of semiconductor chips positioned thereupon. A plurality of coupling structures 404 may be positioned over the wafer 402. In an embodiment of the disclosure, each coupling structure 404 may have a width substantially equal to a width of the semiconductor chip 102 in FIG. 4A. Each coupling structure 404 may include at least one on-wafer contact structure 118*b* positioned in a dielectric layer 120*b*. Each on-wafer contact structure 118*b* may be configured to be aligned with the on-chip contact structure 118*a* of the semiconductor chip 102.

An exemplary process of forming the plurality of coupling structures 404 is described below. The dielectric layer 120*b* may be formed over the wafer 402 using a deposition technique. The dielectric layer 120*b* may be patterned using a patterning technique to form a plurality of openings. A conductive material may be deposited in the plurality of openings using a deposition technique to form a plurality of on-wafer contact structures 118*b*. A chemical-mechanical planarization (CMP) technique may be performed to form a substantially planar topography over the dielectric layer 120*b* and the plurality of on-wafer contact structures 118*b*. Another patterning technique may be performed to form the plurality of coupling structures 404 by defining the width of each coupling structure 404 to be substantially equal to the width of each semiconductor chip 102; each coupling structure 404 may include at least one on-wafer contact structure 118*b* configured to be aligned with the on-chip contact structure 118*a* of the semiconductor chip 102.

Figure 4C:
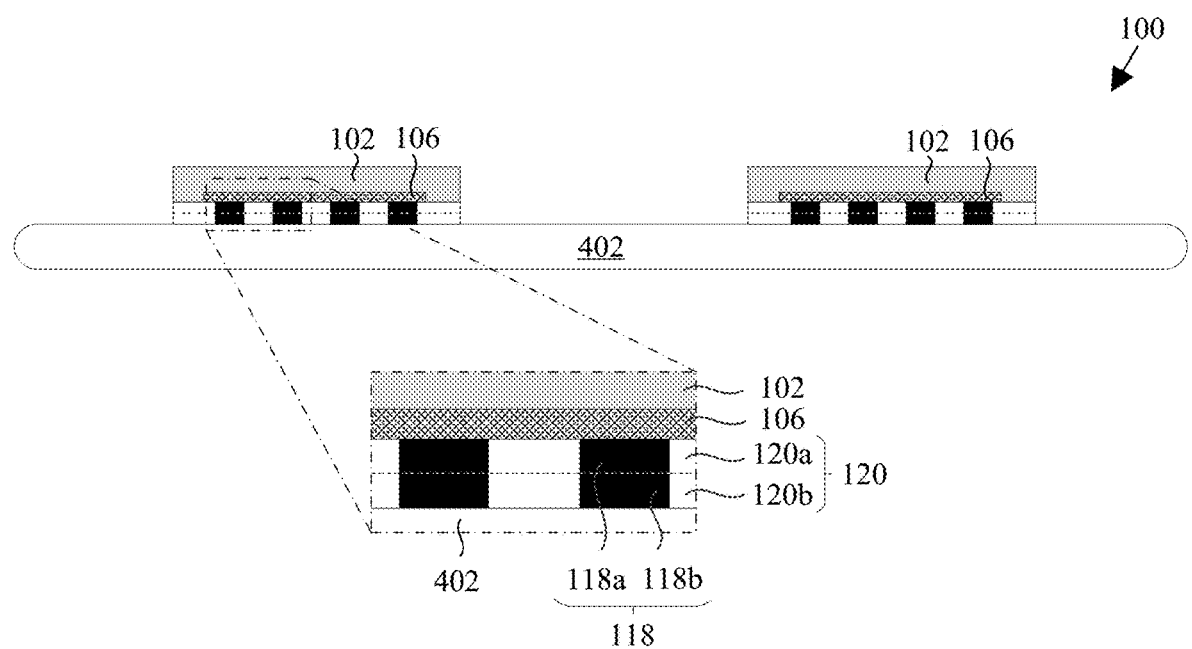

FIG. 4C illustrates the packaged semiconductor device 100 after stacking the plurality of semiconductor chips 102 in FIG. 4A over the plurality of coupling structures 404 in FIG. 4B, according to an embodiment of the disclosure. The plurality of semiconductor chips 102 may be stacked over the plurality of coupling structures 404 in a "face-down" orientation (i.e., electrical connections to the plurality of semiconductor chips 102 are facing "down" towards the wafer 402). The on-chip contact structure 118*a* of each semiconductor chip 102 may be aligned with and in contact with each on-wafer contact structure 118*b* of the coupling structure 404 to form a contact structure 118 of the packaged semiconductor device 100. A stacking interface between the semiconductor chip 102 and the coupling structure 404 is illustrated by a dashed line. The contact structure 118 may enable electrical coupling between the semiconductor chip 102 and a package and/or external interconnects that will be subsequently fabricated.

An exemplary process of stacking the plurality of semiconductor chips 102 over the plurality of coupling structures 404 is described below. A hybrid bonding technique may be performed to stack each semiconductor chip 102 over each coupling structure 404. The hybrid bonding technique may enable the dielectric layer 120*a* and the on-chip contact structure 118*a* of the semiconductor chip 102 to be respectively chemically bonded to the dielectric layer 120*b* and the on-wafer contact structure 118*b* of the coupling structure 404. A post-bond thermal anneal process may be performed to fuse the on-chip contact structure 118*a* of the semiconductor chip 102 with the on-wafer contact structure 118*b* of the coupling structure 404.

Figure 4D:
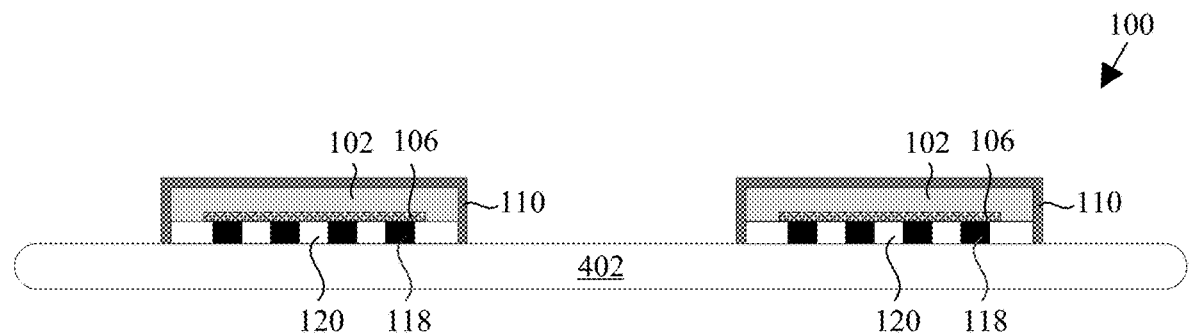

FIG. 4D illustrates the packaged semiconductor device 100 after forming a shielding element 110 over each semiconductor chip 102, according to an embodiment of the disclosure. The shielding element 110 may have a substantially uniform thickness that extends across the semiconductor chip 102 and may be formed by a deposition technique and a patterning technique. In an embodiment of the disclosure, the shielding element 110 over each semiconductor chip 102 may include a blanket layer of shielding material.

In another embodiment of the disclosure, the shielding element 110 over each semiconductor chip 102 may include a patterned layer of shielding material.

An exemplary process of forming the shielding element 110 for each semiconductor chip 102 is described below. A layer of shielding material may be formed over the plurality of semiconductor chips 102 using a deposition technique; the deposition technique being preferably a conformal deposition process. The conformal deposition process may include, but not limited to, an ALD process or a highly-conformal CVD process. The layer of shielding material may overlay the plurality of semiconductor chips 102 and the wafer 402. The layer of shielding material may be patterned using a patterning technique to form the shielding element 110 over each semiconductor chip 102; the shielding element 110 of each semiconductor chip 102 may be spaced apart from the shielding element 110 of an adjacent semiconductor chip 102. In an embodiment of the disclosure, the shielding element 110 may include a material with magnetic permeability such as, but not limited to, cobalt or alloy compositions of zinc including cadmium zinc telluride (CZT), nickel-zinc-copper (Ni—Zn—Cu), zinc ferrite, or combinations thereof.

Even though FIG. 4D illustrates the shielding element 110 terminating at the surface of the wafer 402, it is understood that the shielding element 110 may take on other configurations without departing from the spirit and scope of the present disclosure. For example, the shielding element 110 may at least partially extend over the surface of the wafer 402, although this embodiment is not illustrated.

Figure 4E:
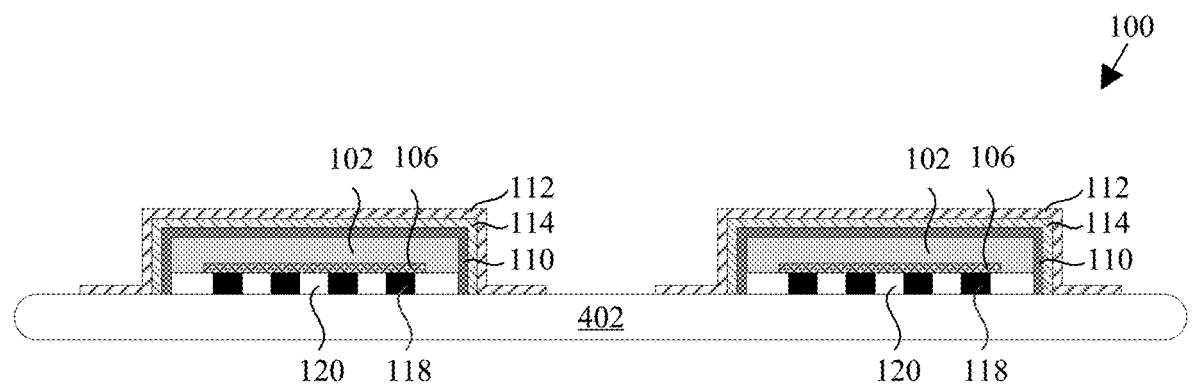

FIG. 4E illustrates the packaged semiconductor device 100 after forming a package conductive component 112 through a plurality of processes, according to an embodiment of the disclosure. The package conductive component 112 may be electrically isolated from the shielding element 110 by an electrically insulative layer 114. The package conductive component 112 may be formed by a deposition technique and a patterning technique.

An exemplary process of forming the package conductive component 112 is described below. A layer of electrically insulative material may be formed over the plurality of semiconductor chips 102 using a deposition technique; the deposition technique being preferably a conformal deposition process. The layer of electrically insulative material may overlay the shielding element 110 of each semiconductor chip 102 and the wafer 402. The layer of electrically insulative material may be patterned using a patterning technique such that the electrically insulative layer 114 of each semiconductor chip 102 may be spaced apart from the electrically insulative layer 114 of an adjacent semiconductor chip 102. In an embodiment of the disclosure, the electrically insulative layer 114 may include an electrically insulative material, for example, polyimide, aluminum oxide, silicon dioxide, silicon nitride, or the like.

A layer of conductive material may be formed over the plurality of semiconductor chips 102 using a deposition technique; the deposition technique being preferably a conformal deposition process. The layer of conductive material may overlay the electrically insulative layer 114 of each semiconductor chip 102 and the wafer 402. The layer of conductive material may be patterned using a patterning technique to form the package conductive component 112 over each semiconductor chip 102; the package conductive component 112 of each semiconductor chip 102 may be spaced apart from the package conductive component 112 of an adjacent semiconductor chip 102. In an embodiment of the disclosure, the package conductive component 112 may include a conductive material, for example, copper, aluminum, conductive adhesives, or plated solder.

Even though FIG. 4E illustrates the electrically insulative layer 114 terminating at the surface of the wafer 402, it is understood that the electrically insulative layer 114 may take on other configurations without departing from the spirit and scope of the present disclosure. For example, the electrically insulative layer 114 may extend over the surface of the wafer 402, although this embodiment is not illustrated.

Figure 4F:
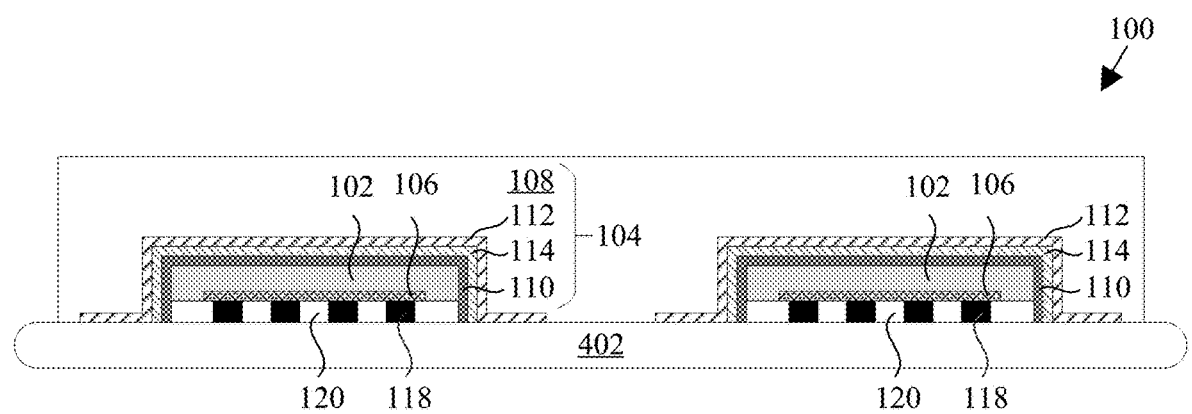

FIG. 4F illustrates the packaged semiconductor device 100 after forming a mold compound 108 over the wafer 402, according to an embodiment of the disclosure. A molding technique may be performed to form the mold compound 108 over the wafer 402; the mold compound 108 may cover the plurality of semiconductor chips 102. The molding technique may include, but not limited to, a compression molding process, an injection molding process, or a transfer molding process. The mold compound 108 may be subjected to a curing process to harden and strengthen the integrity of the mold compound 108. In one embodiment of the disclosure, the mold compound 108 may include an electrically insulative polymer material such as, but not limited to, epoxy, liquid crystal polymer, or a molding compound including phenols.

The mold compound 108, the shielding element 110, the package conductive component 112, and the electrically insulative layer 114 may form a package 104 for the packaged semiconductor device 100. The semiconductor chip 102 may be positioned in the package 104.

Figure 4G:
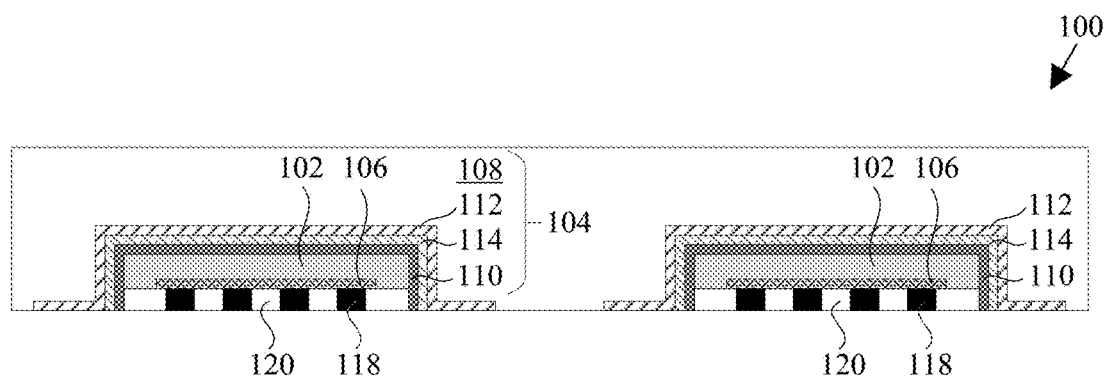

FIG. 4G illustrates the packaged semiconductor device 100 after detaching the wafer 402 from the packaged semiconductor device 100, according to an embodiment of the disclosure. The wafer 402 may be detached using a wafer de-bonding technique. The wafer de-bonding technique may include, but not limited to, a slide de-bonding process, a laser de-bonding process, a chemical de-bonding process, or a mechanical de-bonding process. The contact structures 118, the dielectric layers 120, and the package conductive components 112 may be exposed after the wafer de-bonding technique.

Figure 4H:
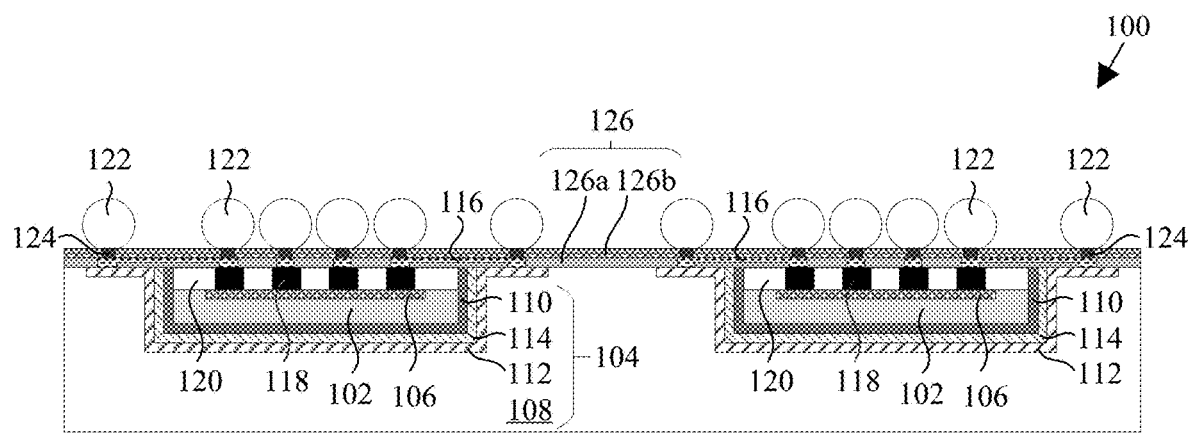

FIG. 4H illustrates the packaged semiconductor device 100 after forming external interconnects 122 through a plurality of processes, according to an embodiment of the disclosure. The packaged semiconductor device 100 may be placed in a "face-up" orientation (i.e., electrical connections to the packaged semiconductor device 100 are facing "up") for the fabrication of the external interconnects 122.

A passivation layer 126 may be formed over the packaged semiconductor device 100. The passivation layer 126 may be a one-layer or a multi-layer passivation stack. In this embodiment of the disclosure, the passivation layer 126 is a multi-layer passivation stack and may include a first passivation film 126a and a second passivation film 126b. In an embodiment of the disclosure, the passivation layer 126 may include an inert material such as, but not limited to, polyimide, polybenzoxazole, benzocyclobuten, silicones, acrylates, or the like. It is understood that the first and second passivation films 126a, 126b may or may not include the same inert material.

A chip RDL 116 may be formed in the first passivation film 126a of each semiconductor chip 102. The chip RDL 116 may enable electrical coupling between the contact structure 118 of each semiconductor chip 102 and their respective package conductive component 112. The first passivation film 126a may advantageously provide electrical isolation between the chip RDL 116 and the shielding element 110 of the package 104.

An exemplary process of forming the chip RDL 116 is described below. The first passivation film 126a may be deposited over the packaged semiconductor device 100 using a deposition technique; the first passivation film 126a overlying the exposed contact structures 118, the dielectric layers 120, and the package conductive components 112. Openings may be formed in the first passivation film 126a to expose portions of the contact structures 118 and/or the package conductive components 112 of each semiconductor chip 102. A conductive material may be deposited in the openings to form the chip RDL 116. A CMP technique may be performed to form a substantially planar topography over the first passivation film 126a and the chip RDL 116. In an embodiment of the disclosure, the conductive material may include copper.

The external interconnects 122 may be formed over the chip RDL 116 of each semiconductor chip 102. Each external interconnect 122 may be electrically coupled to the chip RDL 116 through a contact structure 124. The contact structure 124 may be embedded within the second passivation film 126b.

An exemplary process of forming the contact structure 124 is described below. The second passivation film 126b may be deposited over the first passivation film 126a and the chip RDL 116 using a deposition technique. Openings (not shown) may be formed in the second passivation film 126b to expose portions of the chip RDL 116. A conductive material may be deposited in the openings to form the contact structure 124. A CMP technique may be performed to form a substantially planar topography over the second passivation film 126b and the contact structure 124. In an embodiment of the disclosure, the conductive material may include copper.

The external interconnects 122 may be formed thereupon the contact structures 124 to enable electrical coupling between the packaged semiconductor device 100 and the external components, such as other packaged semiconductor devices or a printed circuit board (PCB), using a wafer bumping process. The external interconnects 122 may include, but not limited to, solder bumps or conductive pillars.

In an embodiment of the disclosure, the packaged semiconductor device 100 may undergo a dicing technique to be diced or singulated into discrete packaged semiconductor devices.

In another embodiment of the disclosure, the packaged semiconductor device 100 may have its thickness thinned down before performing the dicing technique. A material removal technique, such as a mechanical grinding process, also commonly known as a backgrinding process, or a selective etch process, such as a reactive ion etching process may be employed to thin down the packaged semiconductor device by removing portions of the mold compound 108. A polishing technique may be performed after the material removal technique to improve the surface roughness of the thinned packaged semiconductor device 100.

The above disclosure provides solutions for minimizing electromagnetic interferences or coupling between electrical components in a packaged semiconductor device. The package of the packaged semiconductor device may include a magnetic shielding element that shields any potential electromagnetic interference between the electrical components in the semiconductor chip, such as an inductor or a transformer, and the package conductive component in the package.

As the shielding element is formed at the package level, chip designers and package designers may have added design flexibility when assembling a semiconductor chip in a package, without compromising the performance of either the semiconductor chip or the package conductive component.

The terms "upper", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about,", "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of ninety degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. An assembly, comprising:
    a semiconductor chip including a passive component, wherein the semiconductor chip has a back surface and a front surface opposite the back surface, and the passive component is positioned proximal to the front surface of the semiconductor chip; and
    a package in which the semiconductor chip is positioned, wherein the package comprises:
        a shielding element, wherein the shielding element is proximal to the back surface of the semiconductor chip; and
        a package conductive component electrically coupled to the passive component of the semiconductor chip.

2. The assembly of claim 1, wherein the shielding element is spaced apart from the package conductive component.

3. The assembly of claim 1, wherein the shielding element is positioned adjacent to the back surface of the semiconductor chip.

4. The assembly of claim 3, wherein the shielding element extends across the back surface of the semiconductor chip with a substantially uniform thickness.

5. The assembly of claim 3, wherein the semiconductor chip has side surfaces and the shielding element is positioned adjacent to the side surfaces of the semiconductor chip and acquires a U-shaped profile.

6. The assembly of claim 1, wherein the shielding element comprises a material with magnetic permeability.

7. The assembly of claim 6, wherein the material comprises an alloy composition of zinc.

8. The assembly of claim 6, wherein the material comprises cobalt.

9. The assembly of claim 1, wherein the passive component comprises an inductor.

10. The assembly of claim 1, wherein the passive component comprises a transformer.

11. The assembly of claim 1, wherein the package conductive component comprises an inductor.

12. The assembly of claim 1, wherein the package further comprises an electrically insulative layer that spaces apart the shielding element from the package conductive component.

13. The assembly of claim 12, wherein the electrically insulative layer comprises polyimide.

14. An assembly, comprising:
    a semiconductor chip including a passive component; and
    a package in which the semiconductor chip is positioned, the package comprises:
        a mold compound having an upper surface;
        a magnetic shielding element having an upper surface;
        a package conductive component electrically coupling to the passive component of the semiconductor chip; and
        an electrically insulative layer having an upper surface, the electrically insulative layer is interposed between the magnetic shielding element and the package conductive component to electrically isolate the package conductive component from the magnetic shielding element, wherein the upper surface of the mold compound, the upper surface of the magnetic shielding element, and the upper surface of the electrically insulative layer are substantially coplanar.

15. A method of forming an assembly, comprising:
- forming a shielding element over a semiconductor chip having a passive component, the semiconductor chip has a back surface and a front surface opposite the back surface, the back surface is proximal to the shielding element, and the passive component is positioned proximal to the front surface of the semiconductor chip;
- forming a package conductive component over the shielding element;
- forming a mold compound over the package conductive component, wherein the shielding element, the package conductive component, and the mold compound form a package in which the semiconductor chip is positioned; and
- forming interconnects over the semiconductor chip and the package, wherein the interconnects provide electrical coupling between the passive component of the semiconductor chip and the package conductive component.

16. The method of claim 15, further comprising:
- forming an electrically insulative layer over the shielding element to electrically isolate the package conductive component therefrom.

17. The method of claim 15, wherein forming the shielding element comprises a conformal deposition of a material with magnetic permeability over the semiconductor chip.

* * * * *